United States Patent
Bae et al.

(10) Patent No.: US 11,276,580 B2
(45) Date of Patent: Mar. 15, 2022

(54) CONNECTING STRUCTURE OF A CONDUCTIVE LAYER

(71) Applicant: SAMSUNG DISPLAY CO., LTD., Yongin-si (KR)

(72) Inventors: Su Bin Bae, Hwaseong-si (KR); Yu-Gwang Jeong, Anyang-si (KR); Shin Il Choi, Hwaseong-si (KR); Sang Gab Kim, Seoul (KR); Joon Geol Lee, Jeollabuk-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/296,646

(22) Filed: Mar. 8, 2019

(65) Prior Publication Data
US 2019/0348297 A1 Nov. 14, 2019

(30) Foreign Application Priority Data
Apr. 6, 2018 (KR) .................. 10-2018-0040628

(51) Int. Cl.
*H01L 29/41* (2006.01)
*H01L 21/311* (2006.01)
(Continued)

(52) U.S. Cl.
CPC .... *H01L 21/31144* (2013.01); *H01L 21/0271* (2013.01); *H01L 21/763* (2013.01); *H01L 21/76816* (2013.01); *H01L 29/41* (2013.01)

(58) Field of Classification Search
CPC ...................................................... H01L 29/41
See application file for complete search history.

(56) References Cited

U.S. PATENT DOCUMENTS

| 6,417,116 B2 * | 7/2002 | Kudo ................ H01L 21/76802 |
| | | 257/E21.576 |
| 2005/0070086 A1 * | 3/2005 | Isono ................ H01L 21/76838 |
| | | 438/618 |

(Continued)

FOREIGN PATENT DOCUMENTS

| EP | 3240036 | 1/2017 |
| KR | 10-0276442 | 9/2000 |

(Continued)

*Primary Examiner* — Trang Q Tran
(74) *Attorney, Agent, or Firm* — F. Chau & Associates, LLC

(57) ABSTRACT

A connecting structure of a conductive layer includes a first conductive layer, a first insulating layer disposed on the first conductive layer and including a first opening overlapping the first conductive layer, a connecting conductor disposed on the first insulating layer and connected to the first conductive layer through the first opening, an insulator island disposed on the connecting conductor, a second insulating layer disposed on the first insulating layer and including a second opening overlapping the connecting conductor and the insulator island, and a second conductive layer disposed on the second insulating layer and connected to a connecting electrode through the second opening. A sum of a thickness of the first insulating layer and a thickness of the second insulating layer is greater than or equal to 1 µm, and each of the thicknesses of the first and second insulating layers is less than 1 µm.

11 Claims, 3 Drawing Sheets

(51) Int. Cl.
*H01L 21/027* (2006.01)
*H01L 21/768* (2006.01)
*H01L 21/763* (2006.01)

(56) References Cited

U.S. PATENT DOCUMENTS

2005/0093176 A1* 5/2005 Hung ................ H01L 24/05
257/786
2017/0367197 A1* 12/2017 Takano ................ H05K 3/4069

FOREIGN PATENT DOCUMENTS

| KR | 10-0604762 | 7/2006 |
| KR | 10-1273239 | 6/2013 |

* cited by examiner

CONNECTING STRUCTURE OF A CONDUCTIVE LAYER

CROSS-REFERENCE TO RELATED APPLICATION

This application claims priority under 35 U.S.C. § 119 to Korean Patent Application No. 10-2018-0040628, filed in the Korean Intellectual Property Office on Apr. 6, 2018, the disclosure of which is incorporated by reference herein in its entirety.

TECHNICAL FIELD

Exemplary embodiments of the inventive concept relate to a connecting structure of a conductive layer.

DISCUSSION OF RELATED ART

A display device includes two electrodes and an emission member interposed therebetween, where electrons injected from one electrode and holes injected from another electrode are combined in an organic emission layer to generate excitons, and the generated excitons release energy to emit light. By using such light emission, the display device displays a predetermined image.

As a resolution of such a display device increases, the number of wires for driving the display device increases, and the wires are disposed with an insulating layer therebetween.

However, in an etching process, it is not easy to connect the wires disposed with a thick insulating layer therebetween.

SUMMARY

According to an exemplary embodiment of the inventive concept, a connecting structure of a conductive layer includes a first conductive layer, a first insulating layer disposed on the first conductive layer and including a first opening overlapping the first conductive layer, a connecting conductor disposed on the first insulating layer and connected to the first conductive layer through the first opening, an insulator island disposed on the connecting conductor disposed in the first opening, a second insulating layer disposed on the first insulating layer and including a second opening overlapping the connecting conductor and the insulator island, and a second conductive layer disposed on the second insulating layer and connected to a connecting electrode through the second opening. A sum of a thickness of the first insulating layer and a thickness of the second insulating layer may be greater than or equal to 1 µm, and each of the thicknesses of the first and second insulating layers may be less than 1 µm.

The connecting conductor may include a first portion disposed on the first insulating layer, a second portion disposed on a lateral surface of the first opening, and a third portion connected to the first conductive layer.

The insulator island may be disposed on the third portion.

An extension line of an upper surface of the insulator island may be the same as an extension line of an upper surface of the first portion.

The second opening may overlap some of the first portion.

A width of the first opening may be substantially the same as that of the second opening.

The second conductive layer may include a fourth portion disposed on the second insulating layer, a fifth portion disposed on a lateral surface of the second opening, and a sixth portion connected to the first portion.

The sixth portion may be disposed on some of the first portion and on the insulator island.

The second insulating layer and the insulator island may include substantially the same material.

According to an exemplary embodiment of the inventive concept, a connecting structure of a conductive layer may include a first conductive layer, a first insulating layer disposed on the first conductive layer and including a first opening overlapping the first conductive layer, a connecting conductor disposed on the first insulating layer and connected to the first conductive layer through the first opening, an insulator island disposed on the connecting conductor disposed in the first opening, a second insulating layer disposed on the first insulating layer and including a second opening overlapping the connecting conductor and the insulator island, and a second conductive layer disposed on the second insulating layer and connected to a connecting electrode through the second opening. The connecting conductor may include a first portion disposed on the first insulating layer, a second portion disposed on a lateral surface of the first opening, and a third portion connected to the first conductive layer.

A sum of a thickness of the first insulating layer and a thickness of the second insulating layer may be greater than or equal to 1 µm, and each of the thicknesses of the first and second insulating layers may be less than 1 µm.

According to an exemplary embodiment of the inventive concept, a manufacturing method of a connecting structure of a conductive layer may include forming a first insulating layer on a first conductive layer, forming a first opening in the first insulating layer that overlaps the first conductive layer, forming a connecting conductor on the first insulating layer that connects the first conductive layer through the first opening and includes a first portion, a second portion, and third portion, forming a second insulating material layer on the first insulating layer and the connecting conductor, forming a mask pattern on the second insulating material layer, etching the second insulating material layer to form a second insulating layer and an insulator island, the second insulating layer includes a second opening overlapping the third portion and the insulator island, removing the mask pattern, and forming a second conductive layer on the second insulating layer the connects the connecting conductor through the second opening.

DETAILED DESCRIPTION OF THE EMBODIMENTS

Figure 1:
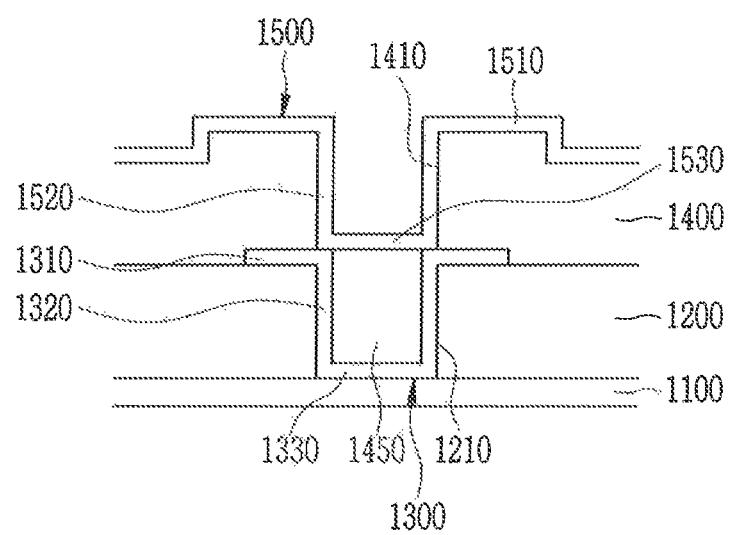
FIG. 1 schematically illustrates a cross-sectional view of a connecting structure of a conductive layer according to an exemplary embodiment of the inventive concept.

Exemplary embodiments of the inventive concept provide a connecting structure for easily connecting two conductive layers disposed with a thick insulating layer therebetween.

Exemplary embodiments of the inventive concept will be described more fully hereinafter with reference to the accompanying drawings. Like reference numerals may refer to like elements throughout this application.

Further, in the drawings, the size and thickness of each element are arbitrarily illustrated for ease of description, and the inventive concept is not necessarily limited to those illustrated in the drawings. In the drawings, the thickness of layers, films, panels, regions, etc. are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

A connecting structure of a conductive layer according to an exemplary embodiment of the inventive concept will now be described with reference to FIG. 1.

FIG. 1 schematically illustrates a cross-sectional view of a connecting structure of a conductive layer according to an exemplary embodiment of the inventive concept.

A connecting structure of a conductive layer according to the present exemplary embodiment is a structure in which two conductive layers 1100 and 1500 are connected to each other by a connecting conductor 1300.

Hereinafter, a stacked structure of a connecting structure of a conductive layer according to the present exemplary embodiment will be described in detail.

Referring to FIG. 1, a first insulating layer 1200 is disposed on the first conductive layer 1100.

The first conductive layer 1100 may include a metal or a semiconductor. When the first conductive layer 1100 includes the semiconductor, the semiconductor may be one of amorphous silicon (a-Si), polycrystalline silicon, or an oxide semiconductor.

The first insulating layer 1200 may include an inorganic material such as a silicon oxide (SiOx) or a silicon nitride (SiNx). However, the first insulating layer 1200 is not limited thereto, and may include an organic material. The first insulating layer 1200 includes a first opening 1210 overlapping the first conductive layer 1100. In this case, a thickness of the first insulating layer 1200 may be less than 1 μm.

The connecting conductor 1300 is disposed on the first insulating layer 1200. The connecting conductor 1300 is directly connected to the first conductive layer 1100 through the first opening 1210. The connecting conductor 1300 includes a first portion 1310 disposed on the first insulating layer 1200, a second portion 1320 disposed on a lateral surface of the first opening 1210, and a third portion 1330 directly connected to the first conductive layer 1100. A distance between a lower surface of the first portion 1310 of the connecting conductor 1300 and an upper surface of the first conductive layer 1100 may be less than 1 μm. The connecting conductor 1300 may include a metal.

An insulator island 1450 is included on the third portion 1330 of the connecting conductor 1300. The insulator island 1450 may include substantially the same material as that included in a second insulating layer 1400 described below. An extension line of an upper surface of the insulator island 1450 may be the same as an extension line of an upper surface of the first portion 1310 of the connecting conductor 1300.

The second insulating layer 1400 is disposed on the first insulating layer 1200 and the first portion 1310 of the connecting conductor 1300. The second insulating layer 1400 may include an inorganic material such as a silicon oxide (SiOx) or a silicon nitride (SiNx). However, the second insulating layer 1400 is not limited thereto, and may include an organic material. Here, the material included in the second insulating layer 1400 may be different from that included in the first insulating layer 1200.

A thickness of the second insulating layer 1400 may be less than 1 μm. A sum of the thickness of the first insulating layer 1200 and the thickness of the second insulating layer 1400 may be greater than or equal to 1 μm.

The second insulating layer 1400 includes the insulator island 1450 and a second opening 1410 overlapping some of the first opening 1210 of the connecting conductor 1300. A width of the second opening 1410 may be substantially the same as that of the first opening 1210.

The second conductive layer 1500 is disposed on the second insulating layer 1400. The second conductive layer 1500 is directly connected to the connecting conductor 1300 through the second opening 1410. Accordingly, the second conductive layer 1500 is connected to the first conductive layer 1100 through the connecting conductor 1300.

The second conductive layer 1500 includes a fourth portion 1510 disposed on the second insulating layer 1400, a fifth portion 1520 disposed on a lateral surface of the second opening 1410, and a sixth portion 1530 directly connected to the connecting conductor 1300. The sixth portion 1530 is disposed on the first portion 1310 of the connecting conductor 1300 and the insulator island 1450. A distance between a lower surface of the fourth portion 1510 of the second conductive layer 1500 and an upper surface of the first insulating layer 1200 may be less than 1 μm. A distance between the lower surface of the fourth portion 1510 of the second conductive layer 1500 and an upper surface of the first conductive layer 1100 may be greater than or equal to 1 μm.

Since it may not be easy to etch the insulating layer at one time due to the thickness of the insulating layer (e.g., having a thickness of 1 μm or more), it may be difficult to connect two conductive layers, with the insulating layer therebetween, to each other. However, in the present exemplary embodiment, it is possible to easily connect the two conductive layers 1100 and 1500 by using the connecting conductor 1300.

In the present exemplary embodiment, although it is described that the first and second insulating layers 1200 and 1400, which are two insulating layers, are disposed between the two conductive layers 1100 and 1500, the inventive concept is not limited thereto, and a number of insulating layers of the two conductive layers 1100 and 1500 may be 3 or more, and a number of the connecting conductors 1300 may be 2 or more.

Now, a manufacturing method of a connecting structure of a conductive layer according to an exemplary embodiment of the inventive concept will be described with reference to FIG. 2 to FIG. 5 and FIG. 1.

FIGS. 2 to 5 schematically illustrate processing diagrams of a manufacturing method of a connecting structure of a conductive layer according to an exemplary embodiment of the inventive concept.

Figure 2:
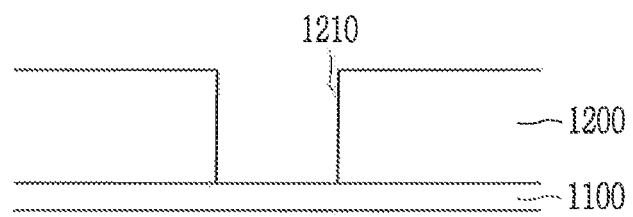
FIGS. 2 to 5 schematically illustrate processing diagrams of a manufacturing method of a connecting structure of a conductive layer according to an exemplary embodiment of the inventive concept.

Referring to FIG. 2, the first conductive layer 1100 is prepared, and the first insulating layer 1200 is formed on the first conductive layer 1100. The first insulating layer 1200 includes the first opening 1210 overlapping the first conductive layer 1100. The thickness of the first insulating layer 1200 may be less than 1 μm. Here, the first opening 1210 may be formed by an etching process using a mask.

Figure 3:
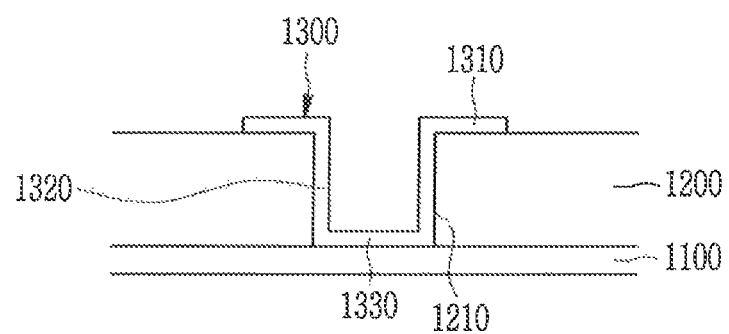

Referring to FIG. 3, the connecting conductor 1300 including the first portion 1310, the second portion 1320, and the third portion 1330 is formed on the first insulating layer 1200. The connecting conductor 1300 is directly connected to the first conductive layer 1100 through the first opening 1210.

The first portion 1310 is disposed on the first insulating layer 1200, the second portion 1320 is disposed on a lateral surface of the first opening 1210, and the third portion 1330 is directly connected to the first conductive layer 1100.

The distance between the lower surface of the first portion 1310 of the connecting conductor 1300 and the upper surface of the first conductive layer 1100 may be less than 1 µm.

Figure 4:
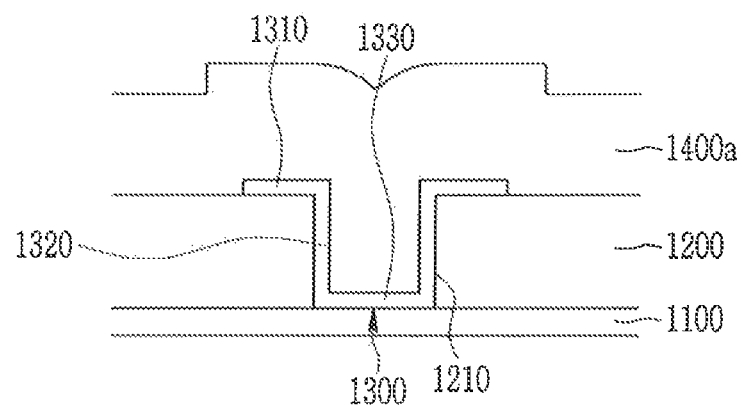

Referring to FIG. 4, a second insulating material layer 1400a is formed on the first insulating layer 1200 and the connecting conductor 1300. The second insulating material layer 1400a is also disposed on the third portion 1330 of the connecting conductor 1300 disposed inside the first opening 1210, and fills the first opening 1210.

Figure 5:
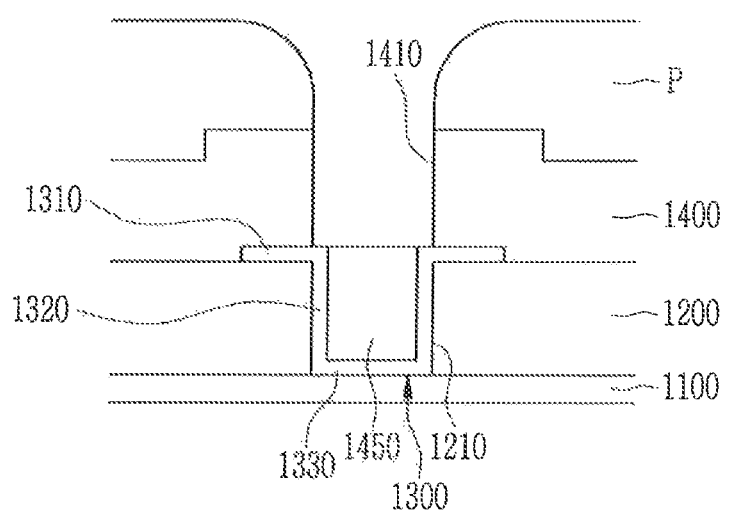

Referring to FIG. 5, a mask pattern P is formed on the second insulating material layer 1400a, and the second insulating material layer 1400a is etched using the mask pattern P as a mask to form the second insulating layer 1400 and the insulator island 1450 that include the second opening 1410.

The width of the second opening 1410 may be substantially the same as that of the first opening 1210. The thickness of the second insulating layer 1400 may be less than 1 µm. The sum of the thickness of the first insulating layer 1200 and the thickness of the second insulating layer 1400 may be greater than or equal to 1 µm.

The insulator island 1450 is formed on the third portion 1330 of the connecting conductor 1300, and the extension line of the upper surface of the insulator island 1450 may be the same as that of the upper surface of the first portion 1310 of the connecting conductor 1300.

Referring again to FIG. 1, the mask pattern P is removed, and the second conductive layer 1500 including the fourth portion 1510, the fifth portion 1520, and the sixth portion 1530 is formed on the second insulating layer 1400. The second conductive layer 1500 is directly connected to the connecting conductor 1300 through the second opening 1410. Accordingly, the second conductive layer 1500 is connected to the first conductive layer 1100 through the connecting conductor 1300.

The fourth portion 1510 is disposed on the second insulating layer 1400, the fifth portion 1520 is disposed on the lateral surface of the second opening 1410, and the sixth portion 1530 is directly connected to the first portion 1310 of the connecting conductor 1300. The sixth portion 1530 is also disposed on the insulator island 1450.

The distance between the lower surface of the fourth portion 1510 of the second conductive layer 1500 and the upper surface of the first insulating layer 1200 may be less than 1 µm. The distance between the lower surface of the fourth portion 1510 of the second conductive layer 1500 and the upper surface of the first conductive layer 1100 may be greater than or equal to 1 µm.

As such, the insulating layer having a thickness of 1 µm or more may be divided into two insulating layers each having a thickness of less than 1 µm to perform an etching process for the two insulating layers, and it is thus possible to easily connect the two conductive layers 1100 and 1500 by using the connecting conductor 1300.

In addition, since it is possible to flatten the first portion 1310 of the connecting conductor 1300 by using the insulator island 1450, the second conductive layer 1500 and the connecting conductor 1300 may be easily connected even if the mask pattern P is misaligned.

As described above, according to exemplary embodiments of the inventive concept, it is possible to easily connect two conductive layers with a thick insulating layer therebetween by disposing a connecting conductor between the two conductive layers.

While the inventive concept has been shown and described with reference to exemplary embodiments thereof, it is to be understood by those of ordinary skill in the art that various modifications in form and details may be made thereto without departing from the spirit and scope of the inventive concept as set forth by the following claims.

What is claimed is:

1. A connecting structure of a conductive layer, comprising:
    a first conductive layer;
    a first insulating layer disposed on the first conductive layer and including a first opening overlapping the first conductive layer;
    a connecting conductor disposed on the first insulating layer and connected to the first conductive layer through the first opening;
    an insulator island disposed on the connecting conductor disposed in the first opening, wherein an uppermost surface of the insulator island and an upper surface of the connecting conductor are coplanar, wherein an uppermost surface of the first insulating layer is at a height different from those of the uppermost surface of insulator island and the upper surface of the connecting conductor;
    a second insulating layer disposed on the first insulating layer and including a second opening overlapping the connecting conductor and the insulator island; and
    a second conductive layer disposed on the second insulating layer and connected to a connecting electrode through the second opening, wherein a sum of a thickness of the first insulating layer and a thickness of the second insulating layer is greater than or equal to 1 µm, and each of the thicknesses of the first and second insulating layers is less than 1 µm,
    wherein a portion of the connecting conductor is disposed under the insulating island and contacts a whole of a lower surface of the insulator island.

2. The connecting structure of the conductive layer of claim 1, wherein the connecting conductor includes:
    a first portion disposed on the first insulating layer,
    a second portion disposed on a lateral surface of the first opening, and
    a third portion connected to the first conductive layer.

3. The connecting structure of the conductive layer of claim 2, wherein the insulator island is disposed on the third portion.

4. The connecting structure of the conductive layer of claim 3, wherein an extension line of an upper surface of the insulator island is the same as an extension line of an upper surface of the first portion.

5. The connecting structure of the conductive layer of claim 4, wherein the second opening overlaps some of the first portion.

6. The connecting structure of the conductive layer of claim 5, wherein a width of the first opening is substantially the same as that of the second opening.

7. The connecting structure of the conductive layer of claim 6, wherein the second conductive layer includes:
    a fourth portion disposed on the second insulating layer, a fifth portion disposed on a lateral surface of the second opening, and a sixth portion connected to the first portion.

8. The connecting structure of the conductive layer of claim 7, wherein the sixth portion is disposed on some of the first portion and on the insulator island.

9. The connecting structure of the conductive layer of claim 1, wherein the second insulating layer and the insulator island include substantially the same material.

10. The connecting structure of the conductive layer of claim 1, wherein the connecting conductor includes a third opening, wherein the insulator island is disposed in the third opening and is separated from the first insulating layer.

11. The connecting structure of the conductive layer of claim 1, wherein a width of the insulator island is smaller than a width of the first conductive layer.

* * * * *